United States Patent
Wu et al.

(10) Patent No.: US 10,224,937 B1
(45) Date of Patent: Mar. 5, 2019

(54) CLOCK AND DATA RECOVERY CIRCUIT HAVING TUNABLE FRACTIONAL-N PHASE LOCKED LOOP

(71) Applicant: Xilinx, Inc., San Jose, CA (US)

(72) Inventors: Zhaoyin D. Wu, San Jose, CA (US); Geoffrey Zhang, San Jose, CA (US); Parag Upadhyaya, Los Gatos, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/959,104

(22) Filed: Apr. 20, 2018

(51) Int. Cl.
| | |
|---|---|
| *H03L 7/08* | (2006.01) |
| *H04L 7/00* | (2006.01) |
| *H04L 1/00* | (2006.01) |
| *H03L 7/197* | (2006.01) |
| *H03L 7/099* | (2006.01) |
| *H04L 7/033* | (2006.01) |

(52) U.S. Cl.
CPC .......... *H03L 7/0807* (2013.01); *H03L 7/0998* (2013.01); *H03L 7/1974* (2013.01); *H04L 1/00* (2013.01); *H04L 7/0025* (2013.01); *H04L 7/0331* (2013.01)

(58) Field of Classification Search
USPC .......................................... 375/376, 233, 327
See application file for complete search history.

(56) References Cited

U.S. PATENT DOCUMENTS

| | | |
|---|---|---|
| 6,600,788 B1 | 7/2003 | Dick et al. |
| 6,876,698 B1 | 4/2005 | Dick et al. |
| 8,786,341 B1 * | 7/2014 | Weltin-Wu ........... H03L 7/1972 327/156 |
| 9,559,704 B1 | 1/2017 | Wong et al. |
| 2007/0253475 A1 * | 11/2007 | Palmer .................... H04L 7/041 375/229 |
| 2015/0270948 A1 * | 9/2015 | Khan .................... H04L 7/0331 375/327 |
| 2015/0349991 A1 * | 12/2015 | Iyer ................... H04L 25/03146 375/233 |
| 2018/0006799 A1 * | 1/2018 | Yadav .................. H04B 10/616 |
| 2018/0183633 A1 * | 6/2018 | Ho .................... H04L 25/03273 |

* cited by examiner

*Primary Examiner* — Eva Y Puente
(74) *Attorney, Agent, or Firm* — Robert M. Brush

(57) ABSTRACT

An example clock and data recovery (CDR) circuit includes a phase interpolator, a fractional-N phase locked loop (PLL) configured to supply a clock signal to the phase interpolator, and a phase detector configured to generate a phase detect result signal in response to phase detection of data samples and crossing samples of a received signal, the data samples and the crossing samples being generated based on a data phase and a crossing phase, respectively, or a sampling clock supplied by a phase interpolator. The CDR circuit further includes a digital loop filter configured to generate a phase interpolator code for controlling the phase interpolator, the digital loop filter including a phase path and a frequency path. The CDR circuit further includes a control circuit configured to control the digital loop filter to disconnect the frequency path from the phase path and to connect the frequency path to a control input of the fractional-N PLL.

20 Claims, 6 Drawing Sheets

CLOCK AND DATA RECOVERY CIRCUIT HAVING TUNABLE FRACTIONAL-N PHASE LOCKED LOOP

TECHNICAL FIELD

Examples of the present disclosure generally relate to electronic circuits and, in particular, to a clock and data recovery circuit having a tunable fractional-N phase locked loop.

BACKGROUND

High-speed data communication systems frequently rely on dock and data recovery (CDR) circuits within the receiver rather than transmitting a reference dock with the data. For example, serial data communication may include the use of a serializer-deserializer (SERDES) at each end of a communication link. Within a SERDES, a CDR may extract a dock that is embedded in the incoming data stream, Once a dock is recovered, the clock is used to sample the incoming data stream to recover individual bits.

A bang-bang CDR scheme is widely used in digital logic to identify the best dock phase to capture the received data. In a bang-bang CDR scheme, the received signal is oversampled to obtain data samples and crossing samples (also referred to as edge samples). A bang-bang CDR uses the data samples and the crossing samples to determine if the data sampling phase should be adjusted, in which direction the data sampling phase should be adjusted, and where to stop the adjustment. Once the data sampling phase dithers around the "best" sampling position, the bang-bang CDR is locked.

SUMMARY

Techniques for clock and data recovery circuit having a tunable fractional-N phase locked loop are described. In an example, a clock and data recovery (CDR) circuit include: a phase interpolator; a fractional-N phase locked loop (PLL) configured to supply a clock signal to the phase interpolator; a phase detector configured to generate a phase detect result signal in response to phase detection of data samples and crossing samples of a received signal, the data samples and the crossing samples being generated based on a data phase and a crossing phase, respectively, or a sampling clock supplied by a phase interpolator; a digital loop filter configured to generate a phase interpolator code for controlling the phase interpolator, the digital loop filter including a phase path and a frequency path; and a control circuit configured to control the digital loop filter to disconnect the frequency path from the phase path and to connect the frequency path to a control input of the fractional-N PLL.

In another example, a receiver includes: sampling circuitry configured to generate data samples and crossing samples of a received signal based on a data phase and a crossing phase, respectively, of a sampling clock; a phase interpolator configured to supply the sampling clock in response to a phase interpolator code; a fractional-N phase locked loop (PLL) configured to supply a clock signal to the phase interpolator; a phase detector configured to generate a phase detect result signal in response to the data samples and the crossing samples; a digital loop filter configured to generate a phase interpolator code for controlling the phase interpolator, the digital loop filter including a phase path and a frequency path; and a control circuit configured to control the digital loop filter to disconnect the frequency path from the phase path and to connect the frequency path to a control input of the fractional-N PLL.

In an example, a method of clock and data recovery in a receiver includes: generating data samples and crossing samples of a received signal based on a data phase and a crossing phase, respectively, of a sampling clock supplied by a phase interpolator in the receiver; supplying a clock signal to the phase interpolator using a fractional-N phase locked loop (PLL); generating a phase detect result signal in response to phase detection of the data samples and the crossing samples; filtering the phase detect result signal through digital loop filter having a phase path and a frequency path to generate a phase interpolator code, the phase interpolator generating the sampling clock based on the phase interpolator code; controlling the digital loop filter to disconnect the frequency path from the phase path and to connect the frequency path to a control input of the fractional-N PLL.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
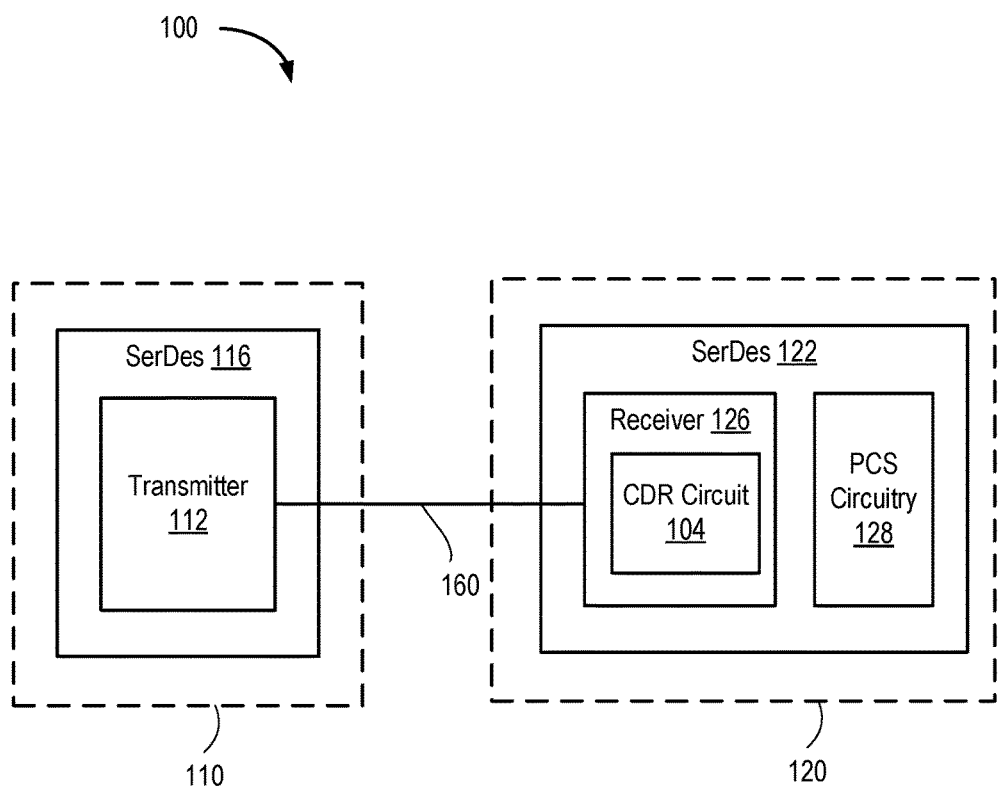
FIG. 1 is a block diagram depicting an example of a serial communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for clock and data recovery circuit having a tunable fractional-N phase locked loop are described. In an example, a clock and data recovery (CDR) circuit includes a phase interpolator and a fractional-N phase locked loop (PLL) that supplies a clock signal to the phase interpolator. A phase detector generates a phase detect result signal based on data and crossing samples of a received signal. The data and cross samples are generated based on data and crossing phases of a sampling clock supplied by the phase interpolator. A digital loop filter generates a phase interpolator code for controlling the phase interpolator. The digital loop filter includes both phase and frequency paths. A control circuit controls the digital loop filter to disconnect the frequency path from the phase path and to connect the frequency path to a control input of the fractional-N PLL.

The techniques described above resolve the issue of phase interpolator step change exceeding specifications. Information from the frequency path is not added to the phase path, and is used instead to tune the fractional-N PLL 212. This results in a reduction in the maximum change in phase interpolator codes between CDR cycles. That is, the architecture uses frequency path information as a controlling signal for the fractional-N PLL. All control is in the digital domain without complications due to signal domain crossing. These and further aspects are discussed below with respect to the drawings.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 generally includes a clock and data recovery (CDR) circuit 104. An example structure of the receiver 126 is described further below with respect to FIG. 2. The receiver 126 receives an analog signal from the transmission medium 160. The CDR circuit 104 operates to recover data and a clock from the analog signal. The receiver 126 provides the recovered data to physical coding sublayer (PCS) circuitry 128 in SerDes 122 for decoding and further processing.

Figure 2:
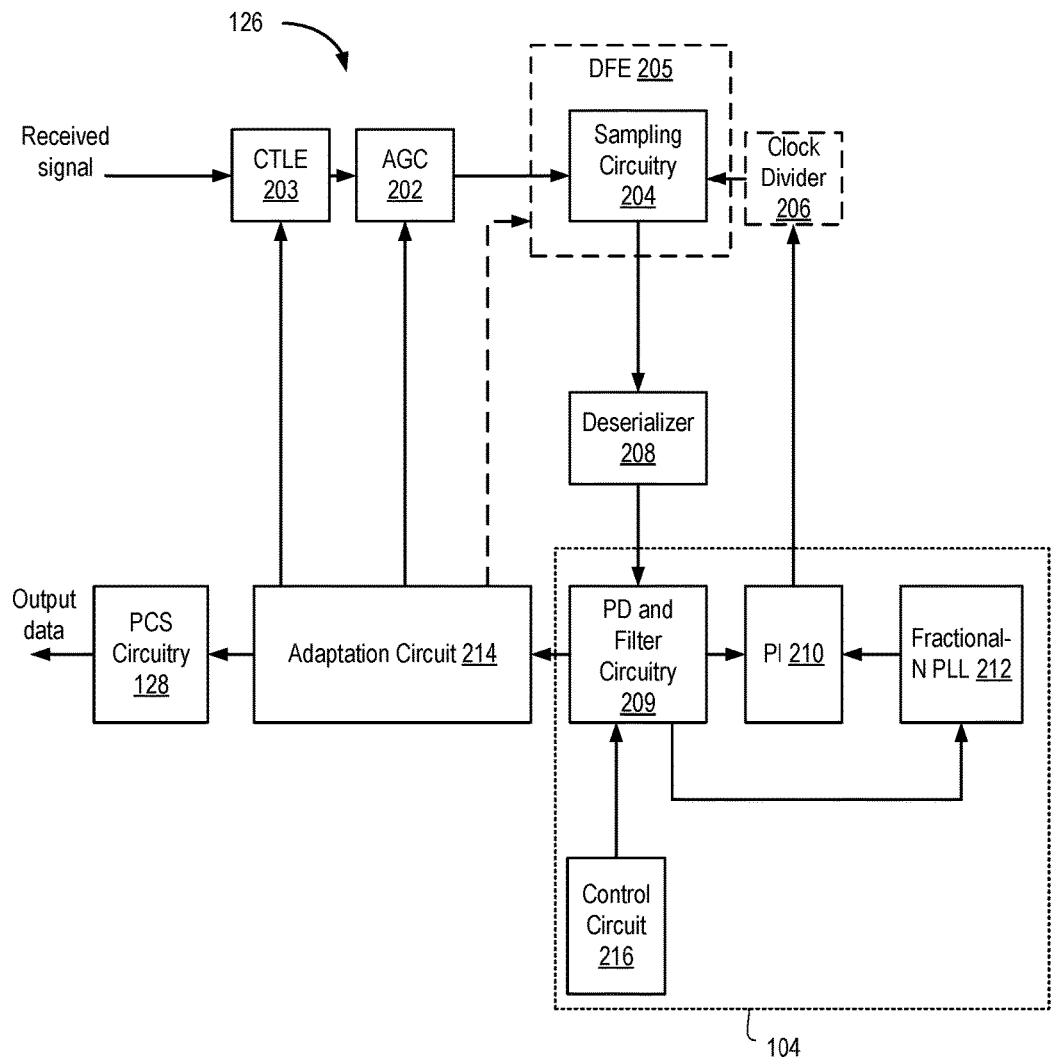
FIG. 2 is a block diagram depicting a receiver according to an example.

FIG. 2 is a block diagram depicting the receiver 126 according to an example. The receiver 126 includes a continuous time linear equalizer (CTLE) 203, an automatic gain control (AGC) circuit 202, sampling circuitry 204, deserializer 208, the CDR circuit 104, and an adaptation circuit 214. The CDR circuit 104 includes phase detector (PD) and filter circuitry 209, a phase interpolator (PI) 210, a fractional-N phase locked loop (PLL) 212, and a control circuit 216.

An output of the CTLE 203 is coupled to an input of the AGC circuit 202. An output of the AGC circuit 202 is coupled to inputs of the sampling circuitry 204. An output of the clock divider 206 is coupled to inputs of the sampling circuitry 204. An output the sampling circuitry 204 is coupled to an input of the deserializer 208. An output of the deserializer 208 is coupled to an input of the PD and filter circuitry 209. Outputs of the PD and filter circuitry 209 are coupled to an input of the adaptation circuit 214, an input of the PI 210, and an input of the fractional-N PLL 212, respectively. Another input of the PI 210 is coupled to an output of the fractional-N PLL 212. In an example, an output of the PI 210 is coupled to an input of the sampling circuitry 204. In another example, the output of the PI 210 is coupled to an input of a clock divider 206, and an output of the clock divider 206 is coupled to an input of the sampling circuitry 204. Outputs of the adaptation circuit 214 are coupled to the CTLE 203, the AGC circuit 202, and the PCS circuitry 128, respectively. In an example, the sampling circuitry 204 can be part of a decision feedback equalizer (DFE) 205. In such case, another output of the adaptation circuit 214 is coupled to the DFE 205.

In operation, the CTLE 203 receives an analog signal from the transmission medium 160. The CTLE 203 operates as a high-pass filter to compensate for the low-pass characteristics of the transmission medium 160. The peak of the frequency response of the CTLE 203 can be adjusted based on a CTLE adjust signal provided by the adaptation circuit 214. The AGC circuit 202 receives the equalized analog signal from the CTLE 203. The AGC circuit 202 adjusts the gain of the equalized signal based on a gain adjust signal provided by the adaptation circuit 214. In another example, the AGC circuit 202 can precede the CTLE circuit 203.

The sampling circuitry 204 generates data and crossing samples from the output of the AGC circuit 202 based on a sampling clock signal supplied by the PI 210. The sampling circuitry 204 can generate the data samples using a data sampling clock and the crossing samples using a crossing sampling clock, where the crossing sampling clock is shifted in phase from the data sampling clock by 90 degrees. The sampling circuitry 204 can generate both the data and crossing sampling clocks from the sampling clock signal supplied by the PI 210 (e.g., using a 90 degree phase shifter). Alternatively, the PI 210 can supply a sampling clock signal that includes both the data and crossing sampling clocks. In another example, the clock divider 206 can generate the data and crossing sampling clocks from the sampling clock signal supplied by the PI 210. The clock divider 206, if present, can also reduce the frequency of the sampling clock signal supplied by the PI 210. In example, the sampling circuitry 204 is part of the DFE 205. The DFE 205 equalizes the output of the AGC circuit 202 to minimize inter-symbol interference (ISI).

Each data and crossing sample includes one or more bits depending on the type of modulation scheme employed (e.g., one bit samples for binary NRZ and multi-bit samples for PAM). The deserializer 208 groups data samples and crossing samples to generate a deserialized signal. The deserializer 208 unifies the two separate parallel data and crossing sample streams into a deserialized signal to be processed by the PD and filter circuitry 209.

Figure 3:
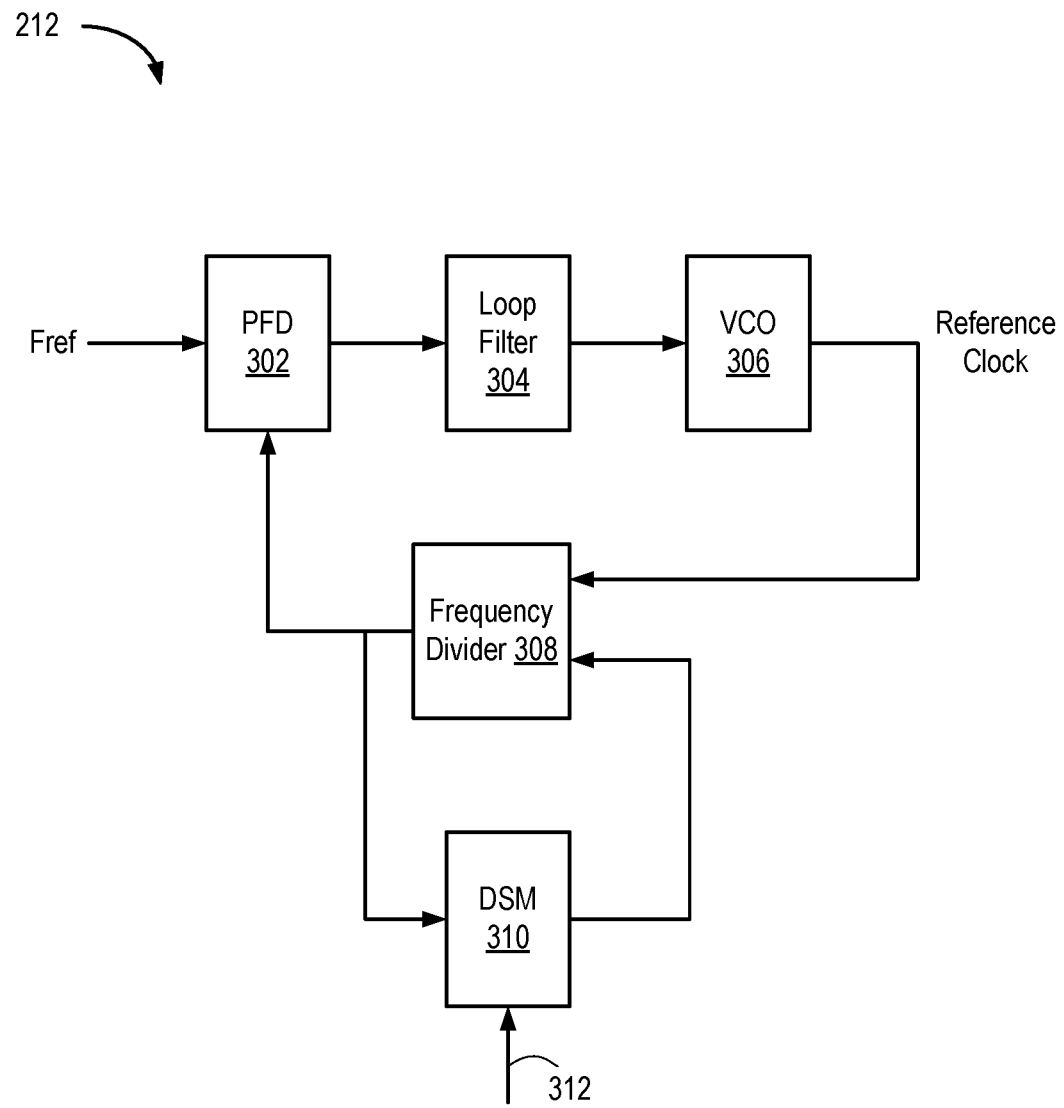
FIG. 3 is a block diagram depicting the fractional-N phase locked loop (PLL) according to an example.
Figure 4:
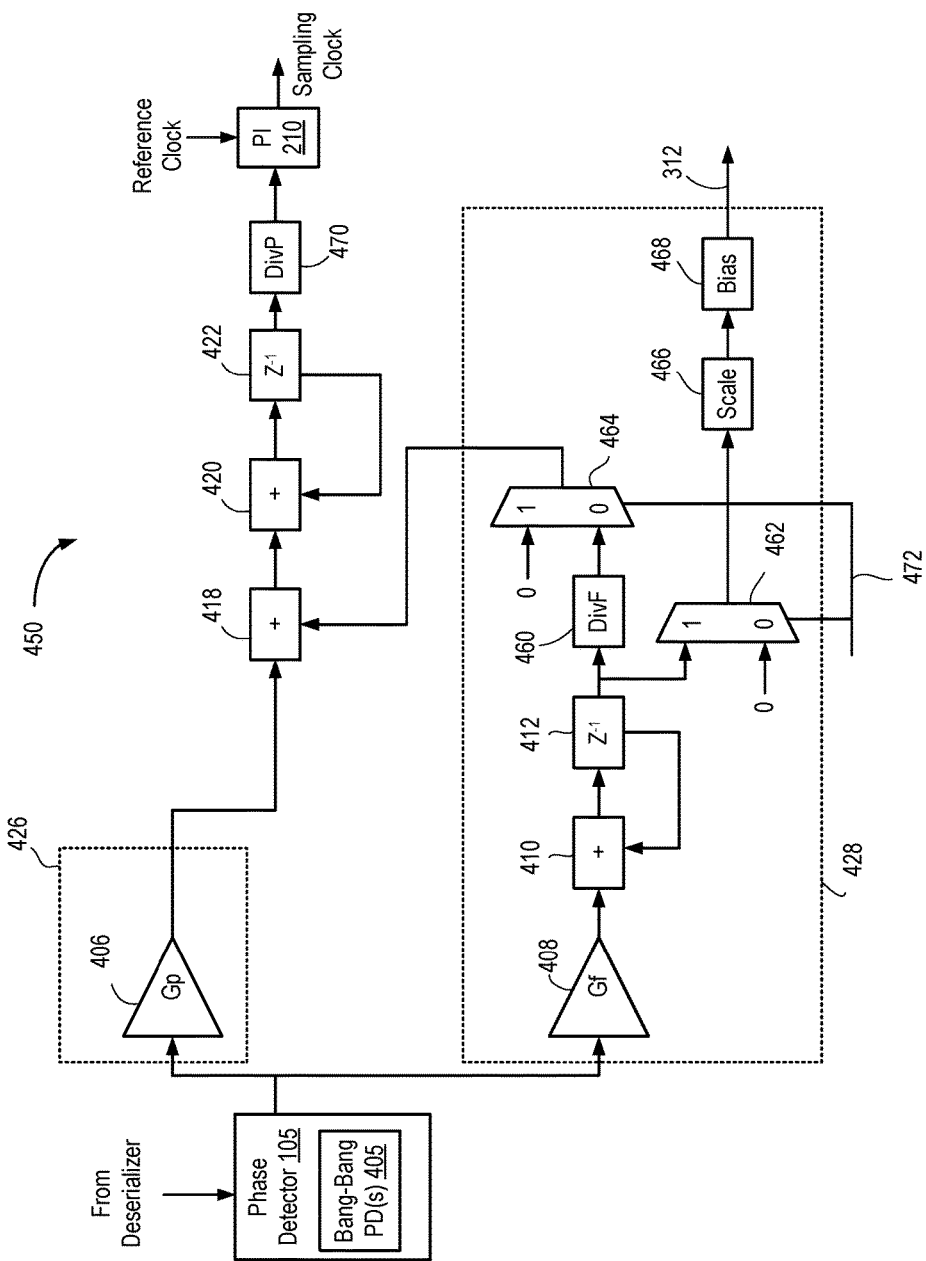
FIG. 4 is a block diagram depicting phase detector and filter circuitry according to an example.

The PD and filter circuitry 209 generates a PI code signal from the deserialized signal generated by the deserializer 208. An example of the PD and filter circuitry 209 is shown in FIG. 4 and described below. The PI 210 receives a reference clock signal from the fractional-N PLL 212. The PI 210 shifts the phase of the reference clock signal based on the PI code signal output by the PD and filter circuitry 209. The PI 210 outputs the phase-shifted reference clock signal as the sampling clock signal. The PD and filter circuitry 209 provide a control signal to the fractional-N PLL 212 for tuning thereof, as discussed further below. An example of fractional-N PLL 212 is shown in FIG. 3 and described below. The control circuit 216 outputs a control signal to the PD and filter circuitry 209. The control circuit 216 controls whether the PD and filter circuitry 209 operates to provide a tuning signal to the fractional-N PLL 212. The control circuit 216 can either enable or disable generation of the tuning signal provided to the fractional-N PLL 212.

The PD and filter circuitry 209 passes a data signal to the adaptation circuit 214. The data signal includes the data samples output by the sampling circuitry 204. The adaptation circuit 214 generates control signals for the CTLE 203 and the AGC circuit 202 based on data signal using known algorithms. If the DFE 205 is present, the adaptation circuit 214 generates a control signal for adjusting the taps of the DFE 205 using a known algorithm. The adaptation circuit 214 outputs the data signal to the PCS circuitry 128. The PCS circuitry 128 processes the data signal to recover the transmitted data.

FIG. 3 is a block diagram depicting the fractional-N PLL 212 according to an example. The fractional-N PLL 212 includes a phase-frequency detector 302, a loop filter 304, a voltage controlled oscillator 306, a frequency divider 308, and a delta-sigma modulator 310 (DSM). An input of the PFD 302 receives a clock signal having a reference frequency Fref. An output of the PFD 302 is coupled to an input of the loop filter 304. An output of the loop filter 304 is coupled to an input of the VCO 306. An output of the VCO 306 is coupled to an input of the frequency divider 308. An output of the frequency divider 308 is coupled to an input of the PFD 302 and an input of the DSM 310, respectively. An output of the DSM 310 is coupled to an input of the frequency divider 308. An input of the DSM 310 receives a control signal 312. The control signal 312 is the tuning signal provided by the PD and filter circuitry 209 discussed above and described further below.

In operation, the PFD 302, loop filter 304, VCO 306, and frequency divider 308 operate to generate a reference clock based on Fref (e.g., some multiple of Fref). The PFD 302 is configured to detect phase and frequency differences between the reference clock and Fref. The PFD 302 outputs a control signal, which is filtered by loop filter 304, for controlling the frequency of VCO 306. The frequency divider 308 divides the frequency of the reference clock for comparison with Fref at the PFD 302. The divisor used by the frequency divider 308 is controlled by the DSM 310. The DSM 310 outputs a control signal to the frequency divider 308 for changing the divisor over time in order to effectively provide a divisor having a integer part and a fractional part. The DSM 310 can be tuned by the PD and filter circuitry 209, as discussed further below.

FIG. 4 is a block diagram depicting the PD and filter circuitry 209 according to an example. The PD and filter circuitry 209 includes the phase detector 105 and a digital loop filter 450. An input of the phase detector 105 is coupled to the output of the deserializer 208. An output of the phase detector 105 is coupled to the digital loop filter 450. An output of the digital loop filter 450 provides a PI code signal, which is coupled to the input of the PI 210. The output of the PI 210 provides the sampling clock signal, as described above. The phase detector 105 includes at least one bang-bang phase detector 405, for example.

In an example, the digital loop filter 450 includes a gain circuit 406, a gain circuit 408, an adder 410, a delay circuit 412, an adder 418, an adder 420, a delay circuit 422, a divider 460 (divF), a multiplexer 462, a multiplexer 464, a scale circuit 466, a bias circuit 468, and a divider 470 (divP). The gain circuit 406 implements a phase path 427. The gain circuit 408, the adder 410, and the delay circuit 412 implement a frequency path 428. Inputs to the gain circuits 406 and 408 are coupled to an output of the phase detector 105. An output of the gain circuit 406 is coupled to an input of the adder 418. An output of the gain circuit 408 is coupled to an input of the adder 410. An output of the adder 410 is coupled to an input of the delay circuit 412. An output of the delay circuit 412 is coupled to another input of the adder 410, to an input of divF 460, and to an input of the multiplexer 462 (the "1" input). An output of divF 460 is coupled to an input of the multiplexer 464 (the "0" input). Another input of the multiplexer 462 (the "0" input) is configured to receive a constant logic '0' signal. Another input of the multiplexer 464 (the "1" input) is configured to receive a constant logic '0' signal. An output of the multiplexer 462 is coupled to an input of the scale circuit 466. An output of the scale circuit 466 is coupled to an input of the bias circuit 468. An output of the bias circuit 468 provides the tuning control signal 312 to the fractional-N PLL. Control inputs of the multiplexers 462 and 464 are coupled to receive a control signal 472 for selecting the "0" or "1" input ports thereof to be passed to their outputs. The control signal 472 can be output from the control circuit 216 (FIG. 2).

An output of the multiplexer 464 is coupled to another input of the adder 418. An output of the adder 418 is coupled to an input of the adder 420. An output of the adder 420 is coupled to an input of the delay circuit 422. An output of the delay circuit 422 is coupled to another input of the adder 420 and to an input of divP 470. An output of divP 470 is coupled to an input of the PI 210.

In operation, consider a case where the control circuit 216 sets the control signal 472 to select the "0" ports of the multiplexers 462 and 464. The phase detector 105 generates a net phase detect result on the data and crossing samples in the deserialized data. The phase detector 105 can include a plurality of bang-bang phase detectors 405 each generating an individual phase detect result based on a pair of data samples and a crossing sample. The bang-bang phase detectors 405 can generate individual phase detect results using different sets of data/crossing samples. The phase detector 105 combines the individual phase detect results to generate the net phase detect result. The phase detector 105 outputs a phase detect result signal having the net phase detect result to the digital loop filter 450.

The digital loop filter 450 performs a CDR algorithm to adjust the PI code based on the phase detect result signal. The gain circuit 406 applies a phase gain (Gp) to the phase detect result signal. For example, the gain circuit 406 can implement a scaling operation to apply the phase gain. The gain circuit 408 applies a frequency gain (Gf) to the phase detect result signal. For example, the gain circuit 408 can implement a scaling operation to apply the frequency gain. The output of the gain circuit 408 is integrated by the adder 410 and the delay circuit 412, the result of which is divided by divF 460 (e.g., a right-shift operation). The integrated output of the frequency path 428 is added to the output of the phase path 426 by the adder 418. The output of the adder 418 is integrated by the adder 420 and the delay circuit 422, the result of which is divided by the divider divP 470 (e.g., a right-shift operation).

In a PI-based CDR circuit, if the receiver is under the condition of independent reference (IR) spread spectrum clocking (SSC) scheme, a high dynamic parts per million (ppm) offset is not uncommon (e.g., 5000 ppm). In a PI-based CDR, if the bus width is 32 bits, the divP 470 divides by 64, and there are 64 PI-steps within one unit interval (UI), then the CDR's ppm resolution of one increment of frequency path will be $(1/divP/64)/\text{bus\_width}*(1\times 10^6) = 1/64/64/32*(1\times 10^6) = 7.63$ ppm in this example. In that example, 7.63 ppm corresponds to 655 at the output of divF 460 for the correction of 5000 ppm. Since this 655 will be added back to the phase path and resulting in the PI code change every CDR cycle (e.g., every 32 UIs in the example), the PI code will be changed 655/divP or approximately 10 codes (or steps) every CDR cycle (assuming ppm offset is a constant 5000 ppm). Even though it is known the SSC ppm will be ramped to 5000 ppm maximum and stay around that range only for a period of time, 10 PI-step (code change every CDR cycle) will be present for the same period of time. In some cases, the PI step change should be limited and not exceed a certain number of codes (e.g., less than 10 PI steps).

The architecture shown in FIG. 4 is provided to resolve the issue of PI step change exceeding specifications of the PI 210. In an example, consider a case where the control circuit 216 sets the control signal 472 to select the "1" ports of the multiplexers 462 and 464. In such case, output of the delay circuit 412 is provided to the scale circuit 466. Likewise, a constant '0' is applied to the second input of the adder 418. That is, information from the frequency path is not added to the phase path. The scale circuit 466 negates and applies a scaling factor to the output of the phase path, and the bias circuit 468 adds a constant bias to generate the tuning signal 312. The tuning signal is applied to the DSM 310 to change the fractional part of the total dividing ratio and thus result in the frequency change of the fractional-N PLL 212. This results in a reduction in the maximum change in PI codes between CDR cycles. That is, the architecture uses frequency path information in the PD and filter circuitry 209 as a controlling signal for the DSM 310. All control is in the digital domain without complications due to signal domain crossing.

Figure 5:
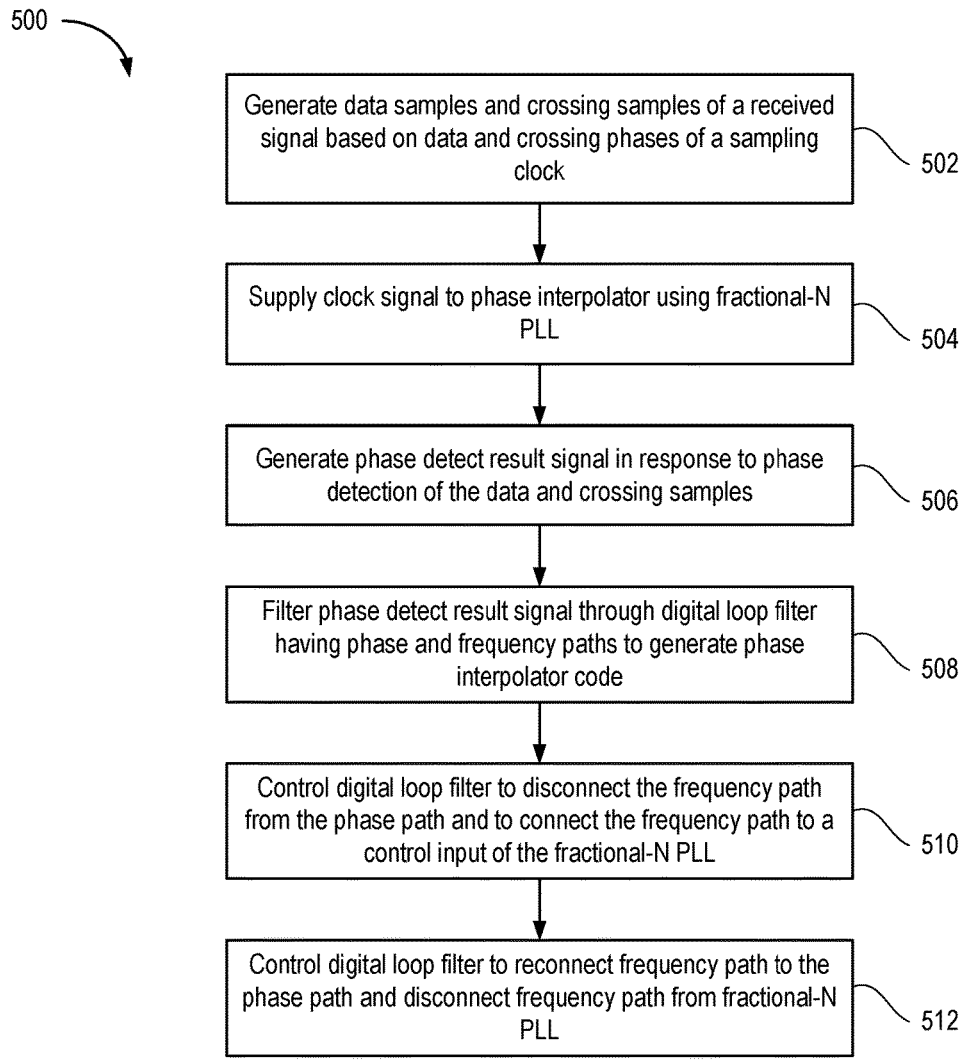
FIG. 5 is a flow diagram depicting a method of clock and data recovery in a receiver according to an example.

FIG. 5 is a flow diagram depicting a method 500 of clock and data recovery in a receiver according to an example. The method 500 begins at step 502, where the sampling circuitry 204 generates data samples and crossing samples of a received signal based on data and crossing phases of a sampling clock provided by the PI 210. The sampling circuitry 204 generates the data samples by sampling the received signal using the data phase of the sampling clock. The sampling circuitry 204 generates the crossing samples by sampling the received signal using the crossing phase of the sampling clock. The data and crossing phases can be ninety degrees apart so that the data samples align with the center of the data eye and the crossing samples align with the edge of the data eye.

At step 504, the fractional-N PLL 212 supplies a clock signal to the PI 210. At step 506, the PD and filter circuitry 209 generates a phase detect result signal in response to phase detection of the data and crossing samples. At step 508, the PD and filter circuitry 209 filters the phase detect result signal through the digital loop filter 450 having the phase and frequency paths 426 and 428, respectively. The digital loop filter 450 generates a phase interpolator code for the PI 210. At step 510, the control circuit 216 controls the digital loop filter 450 to disconnect the frequency path 428 from the phase path 426 and connect the frequency path 428 to a control input of the fractional-N PLL 212. At step 512, the control circuit controls the digital loop filter 450 to reconnect the frequency path 428 to the phase path 426 and disconnect the frequency path 428 from the control input of the fractional-N PLL 212.

Figure 6:
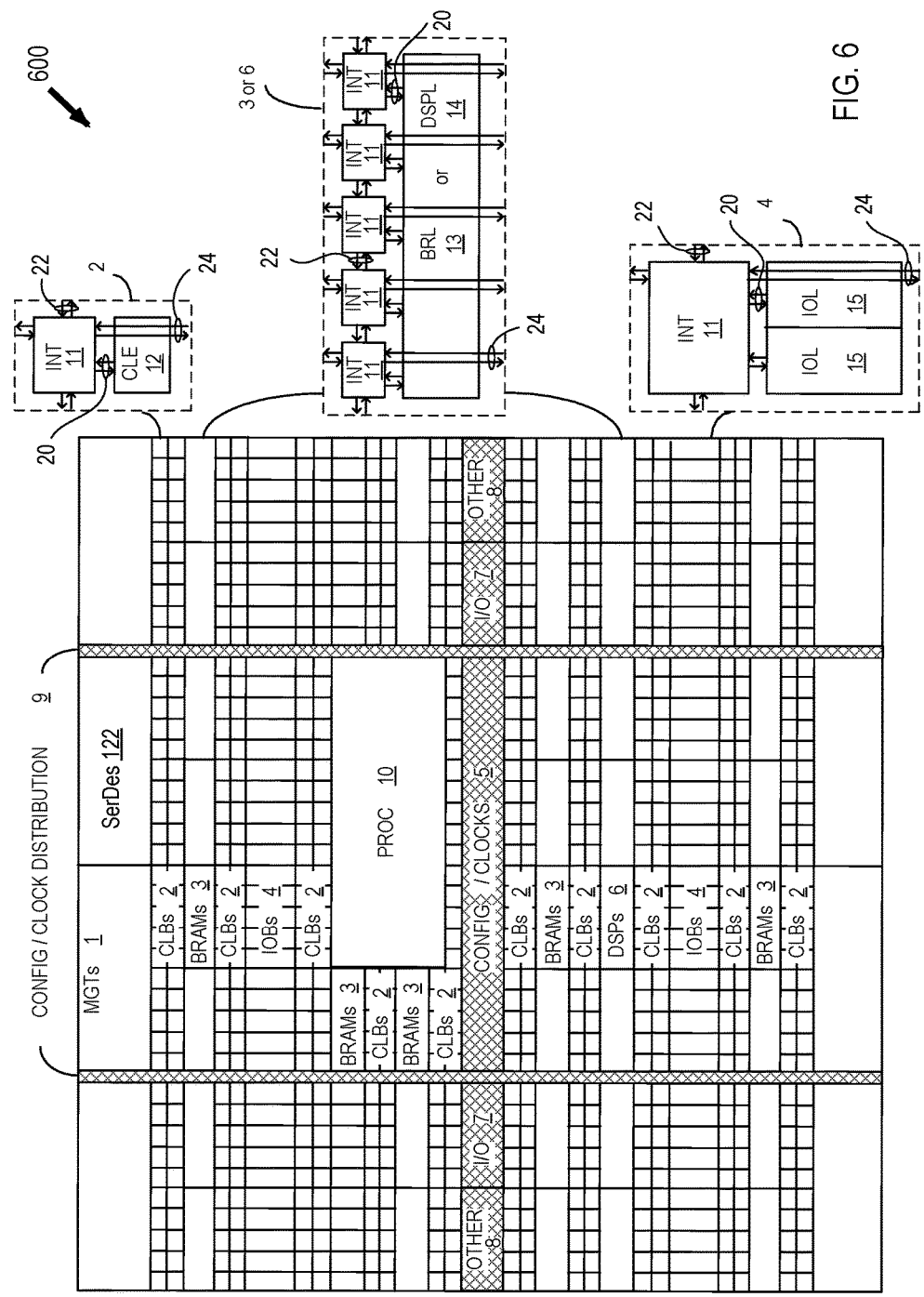
FIG. 6 illustrates an example architecture of a programmable device in which techniques described herein can be employed according to an example.

The SerDes 122 described above can be implemented within an integrated circuit, such as a field programmable gate array (FPGA) or like type programmable circuit. FIG. 6 illustrates an architecture of FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 600 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 1. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 6) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A clock and data recovery (CDR) circuit, comprising:
a phase interpolator;
a fractional-N phase locked loop (PLL) configured to supply a clock signal to the phase interpolator;
a phase detector configured to generate a phase detect result signal in response to phase detection of data samples and crossing samples of a received signal, the data samples and the crossing samples being generated based on a data phase and a crossing phase, respectively, of a sampling clock supplied by the phase interpolator;
a digital loop filter configured to generate a phase interpolator code for controlling the phase interpolator, the digital loop filter including a phase path and a frequency path; and
a control circuit configured to control the digital loop filter to disconnect the frequency path from the phase path and to connect the frequency path to a control input of the fractional-N PLL.

2. The CDR circuit of claim 1, wherein the fractional-N PLL includes a delta-sigma modulator (DSM), and wherein the control input of the fractional-N PLL is coupled to the DSM.

3. The CDR circuit of claim 1, wherein the frequency path comprises:
a scale circuit coupled to the control input of the fractional-N PLL;
an integrator coupled to the phase detector;
a first multiplexer coupled between the integrator and the phase path;
a second multiplexer coupled between the integrator and the scale circuit.

4. The CDR circuit of claim 3, wherein the frequency path further comprises:
a gain circuit coupled between the integrator and the phase detector.

5. The CDR circuit of claim 3, wherein the frequency path further comprises:
a divider coupled between the integrator and the first multiplexer.

6. The CDR circuit of claim 3, wherein the first multiplexer includes a first port coupled to an output of the integrator and a second port configured to receive a constant '0' signal, and wherein the second multiplexer includes a first port configured to receive the constant '0' signal and a second port coupled to the output of the integrator.

7. The CDR circuit of claim 6, wherein the control circuit is coupled to control ports of the first and second multiplexers, respectively, to select either the first port or the second port, respectively.

8. A receiver, comprising:
sampling circuitry configured to generate data samples and crossing samples of a received signal based on a data phase and a crossing phase, respectively, of a sampling clock;
a phase interpolator configured to supply the sampling clock in response to a phase interpolator code;
a fractional-N phase locked loop (PLL) configured to supply a clock signal to the phase interpolator;
a phase detector configured to generate a phase detect result signal in response to the data samples and the crossing samples;
a digital loop filter configured to generate a phase interpolator code for controlling the phase interpolator, the digital loop filter including a phase path and a frequency path; and
a control circuit configured to control the digital loop filter to disconnect the frequency path from the phase path and to connect the frequency path to a control input of the fractional-N PLL.

9. The receiver of claim 8, wherein the fractional-N PLL includes a delta-sigma modulator (DSM), and wherein the control input of the fractional-N PLL is coupled to the DSM.

10. The receiver of claim 8, wherein the frequency path comprises:
a scale circuit coupled to the control input of the fractional-N PLL;
an integrator coupled to the phase detector;
a first multiplexer coupled between the integrator and the phase path;
a second multiplexer coupled between the integrator and the scale circuit.

11. The receiver of claim 10, wherein the frequency path further comprises:
a gain circuit coupled between the integrator and the phase detector.

12. The receiver of claim 10, wherein the frequency path further comprises:
a divider coupled between the integrator and the first multiplexer.

13. The receiver of claim 10, wherein the first multiplexer includes a first port coupled to an output of the integrator and a second port configured to receive a constant '0' signal, and wherein the second multiplexer includes a first port configured to receive the constant '0' signal and a second port coupled to the output of the integrator.

14. The receiver of claim 13, wherein the control circuit is coupled to control ports of the first and second multiplexers, respectively, to select either the first port or the second port, respectively.

15. A method of clock and data recovery in a receiver, comprising:
- generating data samples and crossing samples of a received signal based on a data phase and a crossing phase, respectively, of a sampling clock supplied by a phase interpolator in the receiver;
- supplying a clock signal to the phase interpolator using a fractional-N phase locked loop (PLL);
- generating a phase detect result signal in response to phase detection of the data samples and the crossing samples;
- filtering the phase detect result signal through digital loop filter having a phase path and a frequency path to generate a phase interpolator code, the phase interpolator generating the sampling clock based on the phase interpolator code;
- controlling the digital loop filter to disconnect the frequency path from the phase path and to connect the frequency path to a control input of the fractional-N PLL.

16. The method of claim 15, wherein the fractional-N PLL includes a delta-sigma modulator (DSM), and wherein the control input of the fractional-N PLL is coupled to the DSM.

17. The method of claim 15, wherein the frequency path comprises:
- a scale circuit coupled to the control input of the fractional-N PLL;
- an integrator coupled to the phase detector;
- a first multiplexer coupled between the integrator and the phase path;
- a second multiplexer coupled between the integrator and the scale circuit.

18. The method of claim 17, wherein the frequency path further comprises:
- a gain circuit coupled between the integrator and the phase detector.

19. The method of claim 17, wherein the frequency path further comprises:
- a divider coupled between the integrator and the first multiplexer.

20. The method of claim 17, wherein the first multiplexer includes a first port coupled to an output of the integrator and a second port configured to receive a constant '0' signal, and wherein the second multiplexer includes a first port configured to receive the constant '0' signal and a second port coupled to the output of the integrator.

* * * * *